United States Patent
Goedicke et al.

[11] Patent Number: 6,083,356
[45] Date of Patent: Jul. 4, 2000

[54] METHOD AND DEVICE FOR PRE-TREATMENT OF SUBSTRATES

[75] Inventors: Klaus Goedicke; Fred Fietzke, both of Dresden; Jonathan Reschke, Radebeul; Wolfgang Hempel; Bert Scheffel, both of Dresden; Christoph Metzner, Pappritz; Siegfried Schiller, Dresden, all of Germany

[73] Assignee: Fraunhofer-Gesellshaft zur Forderung der angewandten Forschung e.V., Munich, Germany

[21] Appl. No.: 09/091,099
[22] PCT Filed: Nov. 15, 1996
[86] PCT No.: PCT/EP96/05032
  § 371 Date: Sep. 14, 1998
  § 102(e) Date: Sep. 14, 1998
[87] PCT Pub. No.: WO97/22988
  PCT Pub. Date: Jun. 26, 1997

[30] Foreign Application Priority Data

Dec. 15, 1995 [DE] Germany ............... 195 46 826

[51] Int. Cl.⁷ ...................................... B01J 19/08
[52] U.S. Cl. ........................ 204/164; 422/186.06
[58] Field of Search .................... 204/164, 165; 422/186.05, 186.06

[56] References Cited

U.S. PATENT DOCUMENTS

| | | | |
|---|---|---|---|
| 4,038,165 | 7/1977 | Lowther | 204/164 |
| 4,971,667 | 11/1990 | Yamazaki et al. | 422/186.05 |
| 5,262,033 | 11/1993 | Zega et al. | 204/298.37 |
| 5,286,360 | 2/1994 | Szczyrbowski et al. | 204/298.08 |
| 5,303,139 | 4/1994 | Mark | 204/298.08 |
| 5,433,832 | 7/1995 | Rich et al. | 204/164 |
| 5,490,913 | 2/1996 | Schertler et al. | 204/298.2 |

FOREIGN PATENT DOCUMENTS

| | | |
|---|---|---|
| 0553410 | 8/1993 | European Pat. Off. . |
| 136047 | 6/1979 | Germany . |
| 3144192 | 12/1983 | Germany . |
| 3708717 | 12/1990 | Germany . |
| 91095034 | 11/1991 | Germany . |
| 4239218 | 5/1994 | Germany . |
| 4324683 | 11/1994 | Germany . |
| 4412906 | 7/1995 | Germany . |
| 195 00 262 | 9/1995 | Germany . |
| 292028 | 12/1995 | Germany . |
| 95/03682 | 2/1995 | WIPO . |

OTHER PUBLICATIONS

Haefer, "Oberflächen–und Dünnschicht–Technologie," vol. 1, pp. 30–33 (1987). No Month Available.

Kadlec et al., "Growth and Properties of Hard Coatings Prepared by Physical Vapor Deposition Methods," *Surface and Coatings Technology*, 54/55, pp. 287–296 (1992).

*Primary Examiner*—Kishor Mayekar
*Attorney, Agent, or Firm*—Greenblum & Bernstein, P.L.C.

[57] ABSTRACT

Process and apparatus for pre-treatment of a substrate surface in a vacuum by a glow discharge for a subsequent coating process in a vacuum. The process includes maintaining a low pressure glow discharge between the substrate to be pre-treated and a counter-electrode, where the counter-electrode composed of at least a component of the coating to be deposited in the vacuum coating process. The process also includes periodically alternating a polarity of the substrate to act as a cathode or as an anode of the low pressure glow discharge, and individually controlling at least one of pulse length and discharge voltage in both polarities. A frequency of alternation of the polarity is set within a range of between 1 Hz and 1000 kHz. The apparatus includes an evacuatable vacuum chamber, a substrate holder positioned to hold a substrate to be pre-treated, at least one counter-electrode, and an alternating voltage generator coupled to the substrate to be pre-treated and the at least one counter-electrode. The substrate and the counter-electrode are mounted in a potential-free manner.

15 Claims, 2 Drawing Sheets

METHOD AND DEVICE FOR PRE-TREATMENT OF SUBSTRATES

CROSS-REFERENCE TO RELATED APPLICATIONS

The present application is a U.S. National Stage of International Application No. PCT/EP96/05032 filed Nov. 5, 1996, and claims priority under 35 U.S.C. § 119 of German Patent Application No. 195 46 826.0, filed Dec. 15, 1995.

BACKGROUND OF THE INVENTION

1. Field of the Invention

The invention relates to a method and a related device for the pre-treatment of electrically conductive or non-conducting substrates in a vacuum. The preferred field of application is the treatment of surfaces that require an adhesive coating in a subsequent vacuum coating process. Tools, made of steel, hard metal or ceramic, for example are treated in accordance with the method.

2. Discussion of Background Information

It is known (R. A. Haefer: Oberflächen- und Dünnschicht-Technologie, Vol. I, pp. 30 ff., Springer-Verlag, Berlin 1987) that substrates to be coated in a vacuum have to be exposed to a multi-step treatment process. It usually consists of one or several mechanical or chemical cleaning steps, as well as a subsequent vacuum treatment in the coating facility. Here the interfering surface layers, for example water films or thin oxide layers, are removed, if needed, the nucleation locations for the layer to be deposited are created, or even adhesion-promoting inter-coatings are applied.

Different methods of vacuum pre-treatment have been developed, depending on the electrical conductance of the substrates. Electrically non-conducting substrates, such as glass or oxide ceramics, are often cleaned by a glow discharge, which is ignited between the grounded substrate fastener as the anode and a special glow electrode as the cathode in a working gas, preferably Argon, with a pressure around 10 Pa. The substrate is thereby hit by electrons, which primarily cause the desorption of contaminant layers, in particular of the water film, and cause the substrate to heat up. Condensation nuclei can furthermore be created by the sputtering of the electrode material. The primary disadvantage of this method is based on the low current densities that can be achieved, and thereby its low efficiency. It is furthermore impossible to remove thermally stabile contamination layers, for example made of oxides, with the aid of electron bombardment of the substrate.

Electrically conductive substrates are pre-treated in the simplest manner by using an sputtering process. The discharge required for this is ignited between the negatively biased substrate as the cathode and the grounded vacuum chamber, or an etching electrode, as the anode. The foreign atoms are removed by ion bombardment of the substrate and the surface of the substrate is activated. Additional particles and radiation quanta of the plasma assist the activation by interacting with the substrate surface.

It is known that the effect of the pre-treatment can be increased, depending on the substrate material, by using reducing or oxidizing gas mixtures (DE 31 44 192).

It is furthermore known that the overlay of a magnetic field, in particular in accordance with the magnetron principle, leads to the strengthening of the discharge and thereby to an intensification of the pre-treatment (DD 136 047).

The substrate pre-treatment with a direct current-glow discharge often times exhibits process instabilities. They are caused by the non-conductive areas of the substrate surface, for example isolated areas of oxide, to electrically charge up, and by the sudden release of the glow discharge in a resulting arc discharge. This phenomenon, also referred to as "arcing" does not only impede the removal of the contaminant layers, but also leads to the occurrence of localized damages of the substrate surface.

A known method, which overcomes these disadvantages, is the pre-treatment in a RF-plasma, preferably at a frequency of 13.56 MHz. For non-conductive substrates, a RF-plasma is generally required. With the proper design of the electrode surfaces, a so-called self-bias-voltage occurs, which creates a beam of accelerated ions to the substrate. Numerous elementary processes are thereby triggered, leading to the cleaning of the substrate surface by sputtering and to an activation of the surface. All RF-processes have the disadvantage of exhibiting low efficiency, high energy losses during the electrical adaptation, and an elaborate technical outlay. In particular for substrates with large surfaces, a homogenous substrate pretreatment is practically impossible.

It is also known that a pre-treatment of substrates in vacuum can be achieved by using charged-particle sources. With the aid of electron beam sources, a heating of the substrate and a desorption of volatile adsorption layers is essentially achieved. By bombarding the substrates with ion sources or plasma sources, non-volatile surface layers can also be removed by sputtering (DD 292 028; DE 37 08 717 C2).

The bombardment of the substrate with metal ions (Kadlec et al., Surf. Coat. Technol., 54/55, 1992, 287–296), still results in the creation of a coating mixture of substrate atoms and implanted foreign atoms. The process is therefore also known as "ion mixing". It leads to very good adhesion of the coatings applied subsequently in the vacuum.

All of the stated beam processes for the pre-treatment of substrates have the disadvantage of requiring very elaborate equipment, and are therefore associated with high costs. This is especially true for substrates with large surfaces.

For special applications, for example the pre-treatment of polymer surfaces, the use of microwave-plasmas is known. These do not achieve a removal of contamination layers, but rather the modification of the physical and chemical adhesion properties between the substrate and the coating material. The effectiveness is extremely dependent on the material and tied to the chemical nature of the substrate and the coating material.

SUMMARY OF THE INVENTION

The task of the invention is to propose a method and a related device for the pre-treatment of electrically conducting and non-conducting substrates, which significantly reduces the technical outlay for the substrate pre-treatment, relative to a treatment in RF-plasma or with the aid of beam sources. The effectiveness of the pre-treatment is furthermore to be improved and to be adjusted to the properties of the substrate material, as well as the coating to be applied subsequently. The process should be able to be combined with the actual vacuum coating process without causing any problems.

The present invention provides a process for the pre-treatment of a substrate surface in a vacuum by a glow discharge for a subsequent coating process in a vacuum. A low pressure glow discharge is maintained between the substrate to be cleaned and the counter-electrode, which is made, e.g., of a material of or at least a component of the coating to be deposited in the vacuum coating process. The substrate periodically acts as a cathode or as an anode of the low pressure glow discharge in an alternating manner, and the frequency of the alteration of polarity is set in the range of between 1 Hz to 1000 kHz, and preferably between 20 and 50 Hz. Pulse lengths and/or discharge voltage can be individually controlled in both polarities.

The present invention also provides a device for performing the process of the invention. The device includes a vacuum chamber that can be evacuated, in which the substrate to be pre-treated is fastened and in which at least one counter-electrode is arranged, and a power supply. The substrate and the counter-electrode are mounted potential-free and connected with an alternating voltage generator.

The method in accordance with the invention causes the substrate to be hit with a beam of accelerated electrons and ions in an alternating fashion. The substrate is furthermore exposed permanently to the interactions between additional particles and radiation quanta of a plasma, in particular with high-energy neutral particles and radiation from the plasma. The chemical and physical effect of a portion of the ions making impact is determined by the selection of the electrode material. The counter-electrode is preferably made of the material of the coating to be applied subsequently to the material or at least of a component of the coating material. A reducing gas, for example hydrogen, can be fed into the vacuum chamber during the pre-treatment process, becoming activated or ionized in the plasma, supporting the pretreatment process through chemical reactions. Overall, a very complex physical and chemical reaction on the substrate surface and in the regions near the surface is caused by this method.

Characteristic for the process is its suitability for electrically conducting and non-conducting substrates. The frequency of the changing polarity of the power supply prevents the non-conducting regions of the substrate surface to charge up. The "arcing", present in direct current plasma, is thereby avoided. The frequency of the changing polarity is furthermore determined, such that during each pulse, the ions of the plasma receive a sufficiently high amount of energy from the electrical field of the discharge. It is particularly advantageous to be able to determine the type and intensity of the elementary processes, preferably occurring on the substrate by adjusting the electrical parameters of the power supply device. The chosen relationship of the pulse lengths of both polarities determine the relationship of electron- and ion beam to the substrate. By choosing the discharge voltage in both polarities, the energy distribution of the electrons and ions is determined. One thereby actively influences to what degree such elementary processes, such as desorption of loosely bound adsorbates, sputtering of contaminant layers, sputtering of the substrate material, heating of the substrate and thereby an elevation of the lateral mobility, diffusion processes, and implantation of electrode material in the substrate region close to the surface, are executed. The pre-treatment process is thereby not only a physical and/or chemical cleaning process of the substrate, but is also able to predetermine the adhesion and structure of the layer to be applied in a specific manner.

It can also be advantageous to operate the stated glow-discharge in an oxidizing gas mixture. This is particularly true when the substrate and layer material, due to their chemical nature, undergo oxidative bonding.

The process can be operated particularly advantageously when the counter-electrode is arranged in a field of a special type of magnet assembly—a known magnetron arrangement. The plasma density and the efficiency of the pre-treatment can thereby be increased by orders of magnitude.

In cases in which the subsequent deposition of a coating is to occur by magnetron-sputtering, it is particularly advantageous to use one of the sputtering sources designed for the layer deposition as counter-electrode for the pre-treatment of the substrates.

The device for executing the process in accordance with the invention essentially consists of a vacuum chamber, in which the substrate to be treated is fastened, the counter-electrode, an evacuating unit, and a power supply. An alternating voltage generator, whose terminals are connected to the substrate and to at least one counter-electrode, serves as the power supply.

In addition, the device consists of means by which a working gas can be let into the process chamber and means by which the pressure can be regulated, as they are generally known from plasma processes.

It is effective to construct the alternating voltage generator as a bipolar-pulse-generator, whose pulse lengths and/or output voltages can be adjusted individually for both polarities. In a simplified way, the alternating voltage generator can also be constructed by hooking up a sine wave generator with an adjustable DC voltage source. By overlaying both voltages, it is possible to adjust the ratio of the electron- and ion current on the substrate for the process.

For an efficient device for executing the process, it is functional to provide a water-cooled counter-electrode.

BRIEF DESCRIPTION OF THE DRAWINGS

The object of the invention is explained in more detail with two embodiments. The corresponding drawings show.

DETAILED DESCRIPTION OF THE PRESENT INVENTION

Figure 1:
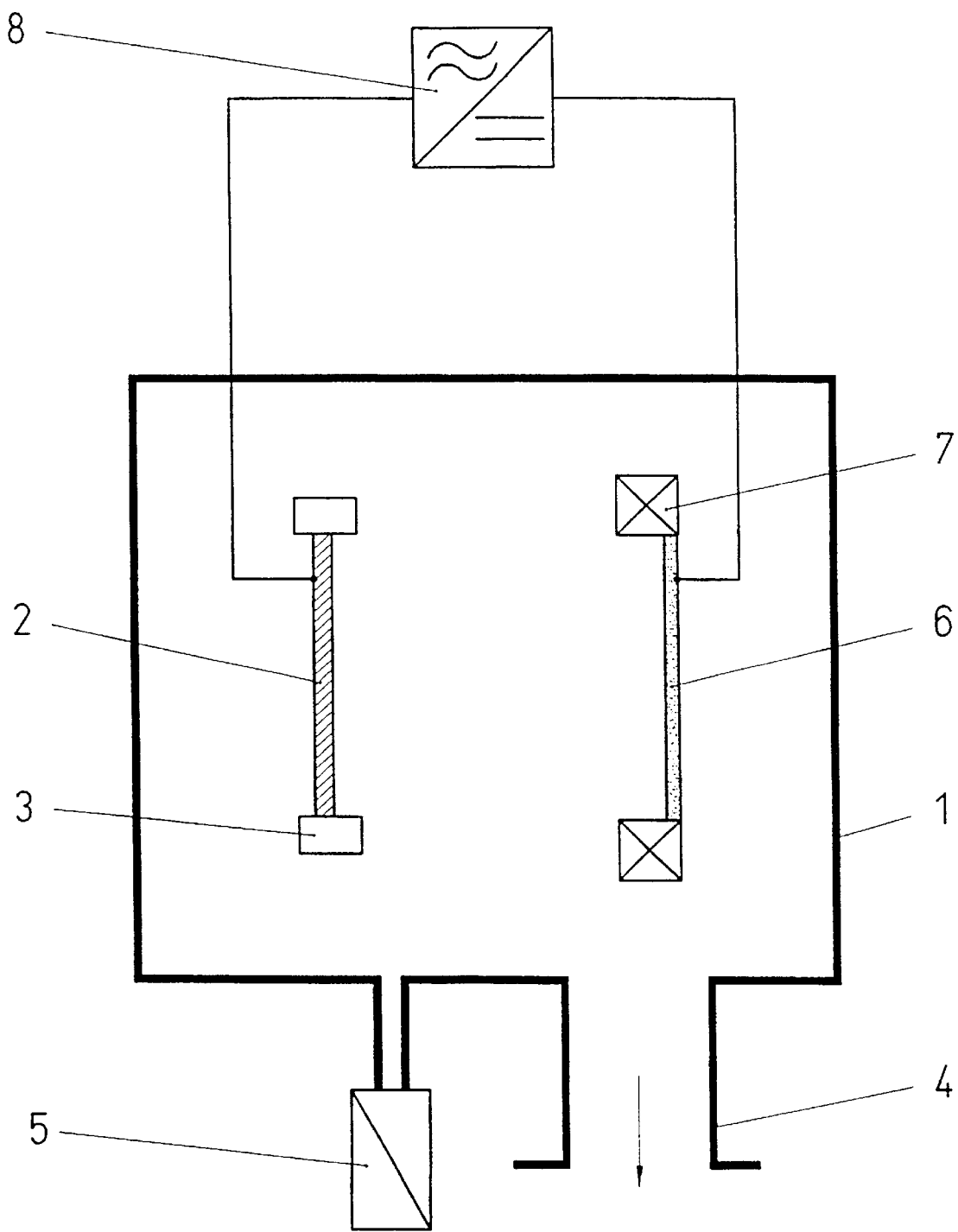
FIG. 1: a device for the pre-treatment of an electrically non-conducting substrate with a bipolar-pulse-generator.

In FIG. 1, a non-conductive substrate 2, made of an oxide ceramic, is placed in a fastener 3 of a process chamber 1. A known vacuum pump system is connected to the evacuation line 4 of the process chamber. An argon-oxygen gas mixture with an oxygen content of 10 vol % is let into the process chamber 1 with the aid of a regulator valve 5, and regulated to a pressure of 0.5 Pa. A counter-electrode 6 is arranged parallel to the substrate 2 at a distance of 100 mm. It is located in the magnetic field of a magnet coil 7. The counter-electrode 6 is made of special steel; the coating to be deposited onto the substrate 2 shall also made of special steel.

For the pre-treatment of the substrate surface, fastener 3, and therefore also the substrate 2, and the counter-electrode 6 are connected in a potential-free manner and connected to the terminals of an alternating voltage generator 8 that is a bipolar-pulse-generator. Its maximum output measures 10 kW with a maximum output voltage of 1500 V for each polarity. The alternating voltage generator 8 is operated with a set frequency for alteration of polarity of 50 kHz. The pulse lengths for the cathodic and the anodic polarity of the substrate 2 are adjusted at a ratio of 20:1. The output voltage for both polarities is set for 1200 V.

With a pre-treatment time of 2 minutes, an average removal of 20 nm on the substrate 2 and a temperature elevation of 410° C. is achieved. In the subsequent coating process, a special steel layer of 20 μm thickness, exhibiting an extremely high degree of adhesion and density, is deposited on the substrate 2 with the aid of electron beam evaporation. A cross-section of the coated substrate 2 shows that an "intermixing zone" of approximately 200 nm was formed as a result, which, aside from the substrate material, also contains metallic components. It was obviously created by implantation and diffusion.

Figure 2:
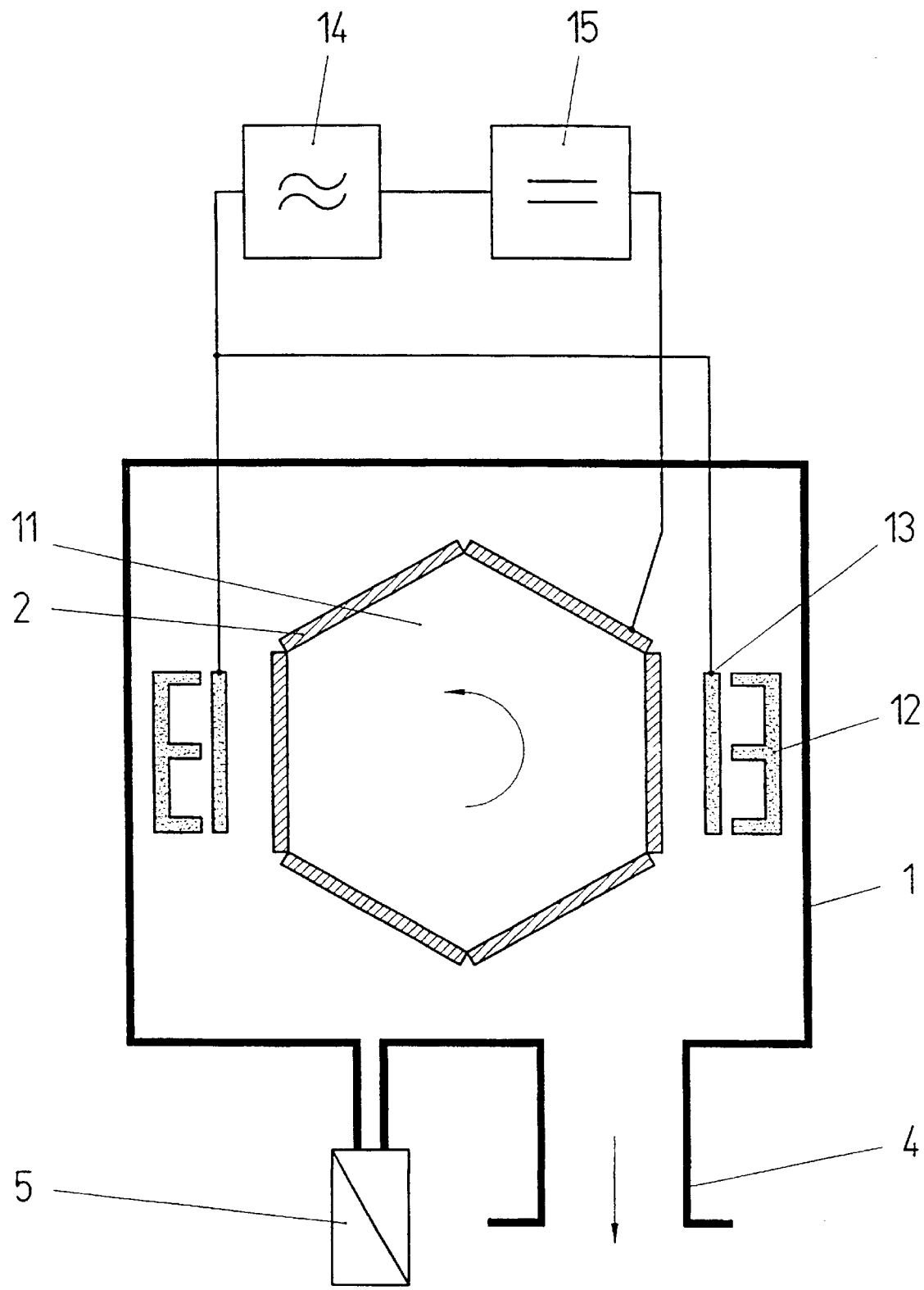
FIG. 2: an arrangement for the pre-treatment of an electrically conducting, partially oxidized substrate with a sine wave generator.

In FIG. 2 the metallic conducting substrates 2 are to be coated with a titanium-oxide layer of 10 μm using reactive magnetron sputtering. The substrates 2, made of cemented carbide, are fastened in a process chamber 1 on a rotating substrate carrier. A known vacuum pump system is connected to the process chamber 1 via the evacuation line 4. The regulator valve 5 is designed to let in the argon gas mixture with a hydrogen content of 5 vol %. The total pressure is held constant at a value of 1 Pa. Two opposite magnetron-sputtering sources 12, with titanium targets 13, are arranged at an average distance of 80 mm to the substrate carrier 11. They also serve the subsequent coating process of the titanium-oxide layer by magentron-sputtering. To execute the substrate pre-treatment, an alternating voltage generator, such as a combination of a sine wave generator 14 and an adjustable DC voltage source 15. is switched between the substrates 2 and the magnetron-sputtering sources 12, which are connected to parallel circuitry, in a potential-free manner. The targets of the magnetron-sputtering sources 12 therefore act as the counter-electrode for the pre-treatment process.

The sine wave generator 14 is operated at a frequency of 50 kHz and an output voltage of 1500 V. The DC voltage source 15 is set at a value of 650 V. Overlaying the two voltages results in the pulse lengths as well as the discharge voltages to be as high or significantly higher with a cathodic polarity than with an anodic polarity. Alternatively, the pulse lengths can be higher in the anodic polarity than in the cathodic polarity. An average removal of less than 10 nm on the substrate 2 and a temperature increase around 300° C. is achieved with a pre-treatment time of 10 minutes. The atomized coatings, deposited after this treatment, exhibit very high adhesion. The scratch test did not reveal any layer separation under 30 N, the maximum load of the equipment.

What is claimed is:

1. A process for pre-treatment of a substrate surface in a vacuum by a glow discharge for a subsequent coating process in a vacuum, the process comprising:

maintaining a low pressure glow discharge between the substrate to be pre-treated and a counter-electrode, the counter-electrode composed of at least a component of the coating to be deposited in the vacuum coating process;

periodically alternating a polarity of the substrate to act as a cathode or as an anode of the low pressure glow discharge; and individually controlling at least one of pulse length and discharge voltage in both polarities, wherein a frequency of alternation of the polarity is set within a range of between 1 Hz and 1000 kHz.

2. The process in accordance with claim 1, wherein the frequency of alternation is between 20 and 50 kHz.

3. The process in accordance with claim 1, further comprising:

magnetically enhancing the low pressure glow discharge in accordance with the magnetron principle.

4. The process in accordance with claim 1, further comprising:

maintaining the low pressure glow discharge in an inert gas.

5. The process in accordance with claim 4, wherein the inert gas is argon.

6. The process in accordance with claim 1, further comprising:

maintaining the low pressure glow discharge in a reducing gas mixture including hydrogen.

7. The process in accordance with claim 1, further comprising:

maintaining the low pressure glow discharge in an oxidizing gas mixture including oxygen.

8. The process in accordance with claims 1, further comprising:

setting an anodic polarity pulse length of the substrate higher than a cathodic polarity pulse length of the substrate.

9. The process in accordance with claims 1, further comprising:

setting a cathodic polarity pulse length of the substrate as high or higher than an anodic polarity pulse length of the substrate.

10. An apparatus for pre-treating a substrate in a vacuum by a glow discharge for a subsequent coating process in a vacuum, the apparatus comprising:

an evacuatable vacuum chamber;

an electrode composed of the substrate to be pre-treated;

at least one counter-electrode; and an alternating voltage generator coupled to the substrate to be pre-treated and the at least one counter-electrode, wherein the substrate to be pre-treated and the counter-electrode are mounted within the vacuum chamber.

11. The apparatus in accordance with claim 10, wherein the substrate to be pre-treated is adapted such that a polarity of the substrate to be pre-treated periodically alternates to act as a cathode or as an anode of the low pressure glow discharge.

12. The apparatus in accordance with claim 10, wherein the alternating voltage generator comprises a bipolar pulse generator with at least one of an individually adjustable pulse length and individually adjustable output voltages for both polarities.

13. The apparatus in accordance with claim 10, wherein the alternating voltage generator comprises a sine wave generator coupled to a controllable DC voltage source.

14. The apparatus in accordance with claim 10, further comprising at least one magnetron-sputter source for use in the vacuum coating process following the pre-treatment process, wherein the magnetron-sputter source is switchable as the counter-electrode.

15. The apparatus in accordance with claim 10, wherein the counter-electrode is water-cooled.

* * * * *